(12) United States Patent
Luan

(10) Patent No.: US 9,313,386 B2
(45) Date of Patent: Apr. 12, 2016

(54) IMAGE DETECTOR WITH LENS ASSEMBLY AND RELATED METHODS

(71) Applicant: STMICROELECTRONICS (SHENZHEN) R&D CO., LTD., Nanshan, Shenzhen (CN)

(72) Inventor: Jing-En Luan, Shenzhen (CN)

(73) Assignee: STMICROELECTRONICS (SHENZHEN) R&D CO. LTD, Shenzhen (CN)

(*) Notice: Subject to any disclaimer, the term of this patent is extended or adjusted under 35 U.S.C. 154(b) by 94 days.

(21) Appl. No.: 14/336,060

(22) Filed: Jul. 21, 2014

(65) Prior Publication Data
US 2015/0029384 A1    Jan. 29, 2015

(30) Foreign Application Priority Data
Jul. 25, 2013  (CN) .......................... 2013 1 0323388

(51) Int. Cl.
| | |
|---|---|
| G02B 13/16 | (2006.01) |
| H04N 5/225 | (2006.01) |
| G02B 7/02 | (2006.01) |
| H01L 27/146 | (2006.01) |

(52) U.S. Cl.
CPC .............. *H04N 5/2254* (2013.01); *G02B 7/025* (2013.01); *H01L 27/14618* (2013.01); *H01L 27/14625* (2013.01); *H01L 27/14685* (2013.01); *H01L 27/14687* (2013.01); *H01L 2924/0002* (2013.01); *Y10T 156/1052* (2015.01)

(58) Field of Classification Search
CPC ........... H04N 5/2254; H01L 27/14618; H01L 27/14625; H01L 27/14687; H01L 27/14685; H01L 2924/0002; G02B 7/025; Y10T 156/1052

USPC ................. 348/335, 340, 345, 348, 350, 352; 438/65; 359/819

See application file for complete search history.

(56) References Cited

U.S. PATENT DOCUMENTS

| | | | |
|---|---|---|---|
| 4,458,152 A | 7/1984 | Bonora | |
| 5,374,787 A | 12/1994 | Miller et al. | |
| 5,495,077 A | 2/1996 | Miller et al. | |
| 5,648,642 A | 7/1997 | Miller et al. | |
| 6,281,882 B1 | 8/2001 | Gordon et al. | |
| 2009/0057544 A1 | 3/2009 | Brodie et al. | |
| 2010/0079635 A1* | 4/2010 | Yano ................... | G02B 3/0062 348/294 |
| 2010/0321564 A1* | 12/2010 | Feldman ................ | G02B 9/12 348/374 |
| 2011/0032409 A1* | 2/2011 | Rossi ..................... | G02B 5/005 348/340 |
| 2011/0149143 A1* | 6/2011 | Tsujino ................ | G02B 3/0031 348/374 |
| 2011/0250928 A1 | 10/2011 | Schlub et al. | |
| 2012/0035883 A1 | 2/2012 | Teissier et al. | |
| 2012/0132793 A1 | 5/2012 | Campbell et al. | |
| 2012/0133955 A1 | 5/2012 | Baxter | |
| 2012/0133956 A1 | 5/2012 | Findlay et al. | |
| 2012/0139870 A1 | 6/2012 | Beyly et al. | |
| 2012/0153120 A1 | 6/2012 | Baxter | |
| 2012/0194479 A1 | 8/2012 | Stark et al. | |

(Continued)

*Primary Examiner* — Yogesh Aggarwal
(74) *Attorney, Agent, or Firm* — Allen, Dyer, Doppelt, Milbrath & Gilchrist, P.A.

(57) ABSTRACT

An electronic device may include a substrate, an image sensor IC over the substrate, and a lens assembly above the substrate. The lens assembly may include a spacer above the substrate, a first adhesive layer over the spacer, a lens aligned with the image sensor IC and over the first adhesive layer, a second adhesive layer surrounding a peripheral surface of the lens and the first adhesive layer, and a baffle over the lens and the second adhesive layer.

25 Claims, 5 Drawing Sheets

(56) References Cited

U.S. PATENT DOCUMENTS

2012/0248625 A1  10/2012  Coffy et al.
2013/0267273 A1* 10/2013  Rudmann ............. G01S 17/026
                                                                    455/556.1

* cited by examiner

IMAGE DETECTOR WITH LENS ASSEMBLY AND RELATED METHODS

TECHNICAL FIELD

The present disclosure relates to the field of sensor devices, and, more particularly, to a proximity detector device and related methods.

BACKGROUND

Typically, electronic devices include one or more image sensor modules for providing enhanced media functionality. For example, the typical electronic device may utilize the image sensor modules for photo capturing and video teleconferencing. Some electronic devices include additional image sensor devices used for other purposes, such as a proximity detector.

For example, the electronic device may use the proximity detector to provide object distances for providing focusing adjustment to the camera purposed image sensor modules. In mobile device applications, the proximity detector may be used to detect when the user's hand is nearby, thereby quickly and accurately waking the device from a power saving sleep mode. Typically, the proximity detector comprises a light source directing radiation to a potential nearby object, and an image sensor receiving the radiation reflected off of the nearby object.

For example, U.S. Patent Application No. 2009/0057544 to Brodie et al, assigned to the present application's assignee, discloses an image sensor module for a mobile device. The image sensor module comprises a lens, a housing carrying the lens, and a lens cap over the lens and housing. The image sensor module includes a barrel mechanism for adjusting the lens. During manufacture of an electronic device including one or more image sensor modules, there is a desire to manufacture the electronic device as quickly as possible, particularly in mass production runs.

The typical image sensor module is manufactured in a multi-step process. The first steps include semiconductor processing to provide the image sensor integrated circuit (IC). The next steps include some form of testing for the image sensor IC and packaging. The image sensor IC may be assembled into the image sensor module, along with a lens and movable barrel if needed. This assembly of the image sensor module may be performed manually or via machine. For example, in electronic devices that use surface mounted components, a pick-and-place (P&P) machine may assemble the components onto a printed circuit board (PCB). A drawback to such singular packaging is that it may be relatively inefficient and also may require that each device be tested individually, adding to the manufacturing time.

An approach to an image sensor is disclosed in U.S. Patent Application Publication No. 2012/0248625 to Coffy et al., assigned to the present application's assignee. This image sensor comprises a transparent support, a pair of ICs on the transparent support, and encapsulation material on the transparent support and surrounding the pair of ICs.

Referring now to FIG. 1, a lens assembly 20 for a proximity detector, as in the prior art, is shown. The lens assembly 20 includes a frame 27, a first adhesive layer 25 on the frame, a spacer 26 on the first adhesive layer, and first and second lenses 23a-23b carried by the spacer. The lens assembly 20 includes a baffle 22, and a second adhesive layer 24 between the baffle and the first and second lenses 23a-23b. The lens assembly 20 includes first and second resin portions 21, 28 on the periphery of the first and second lenses 23a-23b.

SUMMARY

Generally speaking, an electronic device may comprise a substrate comprising a dielectric layer, and a plurality of electrically conductive traces over the dielectric layer, an image sensor IC over the substrate, and a lens assembly above the substrate. The lens assembly may include a spacer above the substrate, a first adhesive layer over the spacer, at least one lens aligned with the image sensor IC and over the first adhesive layer, a second adhesive layer surrounding a peripheral surface of the at least one lens and the first adhesive layer, and a baffle over the at least one lens and the second adhesive layer. Advantageously, the lens assembly may be mechanically robust and easy to manufacture.

DETAILED DESCRIPTION

Figure 1:
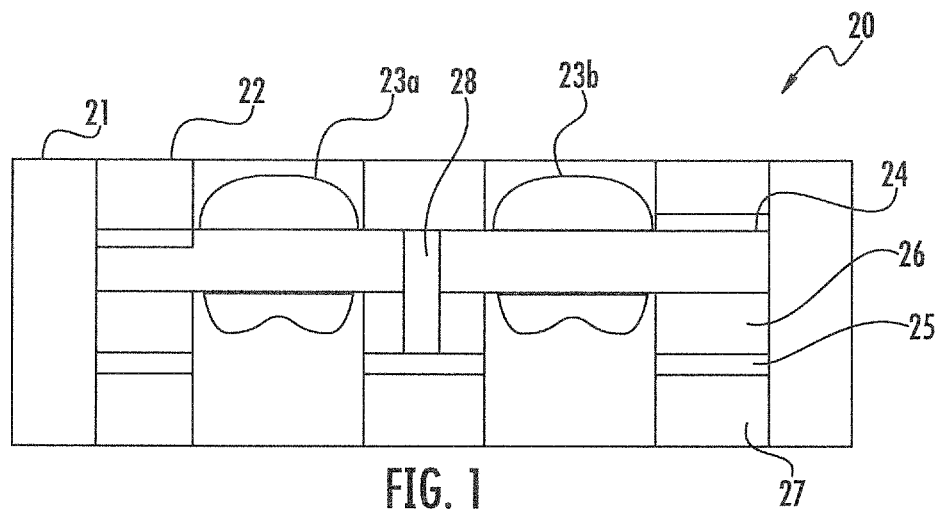
FIG. 1 is a schematic side view of a lens assembly, according to the prior art.

The present disclosure will now be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and multiple prime notations are used to indicate similar elements in alternative embodiments.

Generally speaking, an electronic device may comprise a substrate comprising a dielectric layer, and a plurality of electrically conductive traces carried thereby, an image sensor IC carried by the substrate, and a lens assembly above the substrate. The lens assembly may include a spacer above the substrate, a first adhesive layer carried by the spacer, at least one lens aligned with the image sensor IC and carried by the first adhesive layer, a second adhesive layer surrounding a peripheral surface of the at least one lens and the first adhesive layer, and a baffle carried by the at least one lens and the second adhesive layer. Advantageously, the lens assembly may be mechanically robust and easy to manufacture.

In particular, the spacer, the second adhesive layer, and the baffle may have aligned peripheral surfaces. The second adhesive layer may comprise opaque material.

In some embodiments, the electronic device may further comprise an other IC carried by the substrate, and the at least one lens may comprise a first lens aligned with the image sensor IC, and a second lens aligned with the other IC. The other IC may comprise at least one of a light source IC, and an additional image sensor IC.

Additionally, the at least one lens may comprise a base layer having first and second opposing sides, a convex lens layer on the first opposing side, and a concave lens layer on the second opposing side. The electronic device may further comprise a third adhesive layer between the substrate and the lens assembly. The substrate may comprise a plurality of electrically conductive contacts carried by the dielectric layer and coupled to the plurality of electrically conductive traces. For example, the at least one lens may comprise a filter lens.

Another aspect is directed to a method making a plurality of lens assemblies. The method may comprise adhesively joining a lens wafer to a spacer wafer with a first adhesive layer, the lens wafer comprising a plurality of lenses, and forming a plurality of recesses extending through the lens wafer and first adhesive layer, and into the spacer wafer, each recess being between adjacent lenses. The method may include filling the recesses with a second adhesive layer, adhesively joining a baffle wafer onto the second adhesive layer, and dicing the joined-together spacer wafer, lens wafer, and baffle wafer to define the plurality of lens assemblies.

Additionally, the spacer wafer may comprise a plurality of openings, and the adhesive joining of the lens wafer to the spacer wafer may include aligning the plurality of openings with the plurality of lenses. The method may further comprise curing the joined-together lens wafer and spacer wafer. The baffle wafer may include a plurality of openings, and the adhesive joining of the baffle wafer to the lens wafer and the spacer wafer may include aligning the plurality of openings with the plurality of lenses. The method may further comprise forming the spacer wafer on a carrier layer, and release the carrier layer after the dicing.

Another aspect is directed to a method making an electronic device comprising forming a substrate comprising a dielectric layer, and a plurality of electrically conductive traces carried thereby. The method may include forming an image sensor IC carried by the substrate, and forming a lens assembly above the substrate. The lens assembly may include a spacer above the substrate, a first adhesive layer carried by the spacer, at least one lens aligned with the image sensor IC and carried by the first adhesive layer, a second adhesive layer surrounding a peripheral surface of the at least one lens and the first adhesive layer, and a baffle carried by the at least one lens and the second adhesive layer.

Figure 2:
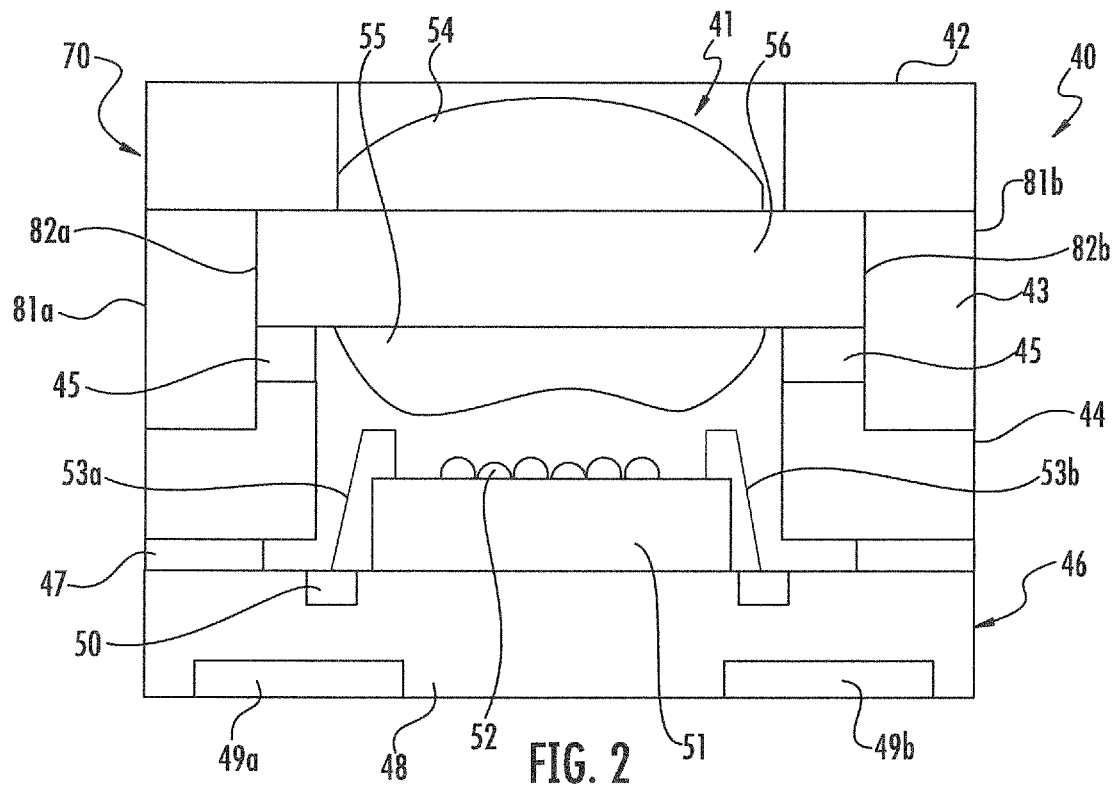
FIG. 2 is a schematic side view of an electronic device, according to the present disclosure.

Referring now to FIG. 2, an electronic device 40 according to the present disclosure is now described. The electronic device 40 may comprise a proximity detector device in some embodiments.

The electronic device 40 illustratively includes a substrate 46 comprising a dielectric layer 48 (e.g. comprising silicon, GaAs), and a plurality of electrically conductive traces 50 (e.g. comprising copper or aluminum) carried thereby (over the dielectric layer). The substrate 46 illustratively includes a plurality of electrically conductive contacts 49a-49b (e.g. comprising copper or aluminum) carried by the dielectric layer (over the dielectric layer) and coupled to the plurality of electrically conductive traces 50. For example, the plurality of electrically conductive contacts 49a-49b may comprise ball grid array (BGA) or the illustrated land grid array (LGA) electrically conductive contacts.

The electronic device 40 illustratively includes an image sensor IC 51 carried by (over) the substrate 46. The image sensor IC 51 includes an image sensing surface 52 comprising a plurality of sensing pixels. The substrate 46 comprises a plurality of wire bonds 53a-53b (e.g. comprising copper or aluminum) coupling the image sensor IC 51 to the plurality of electrically conductive traces 50. In other words, the image sensor IC 51 in the illustrated embodiment is a front side illumination type image sensor. In other embodiments, the image sensor IC 51 may comprise a backside illumination type image sensor.

The electronic device 40 illustratively includes a lens assembly 70 above the substrate 46, and a third adhesive layer 47 between the substrate and the lens assembly. The lens assembly 70 illustratively includes a spacer 44 above the substrate 46, a first adhesive layer 45 carried by (over) the spacer, and a lens 41 aligned with the image sensor IC 51 and carried by (over) the first adhesive layer. The first adhesive layer 45 joins together the spacer 44 and the lens 41.

Additionally, the lens 41 illustratively includes a base layer 56 having first and second opposing sides, a convex lens layer 54 on the first opposing side, and a concave lens 55 layer on the second opposing side. For example, the lens 41 may comprise a filter lens (e.g. filtering out infrared radiation).

Figure 3:
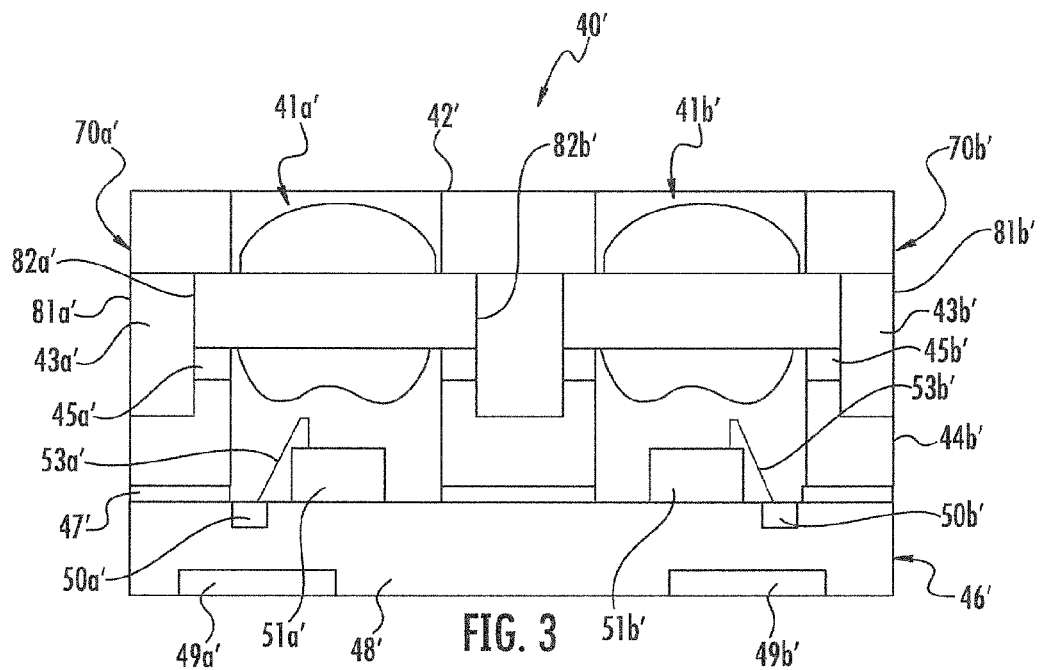
FIG. 3 is a schematic side view of another embodiment of an electronic device, according to the present disclosure.
Figure 4:
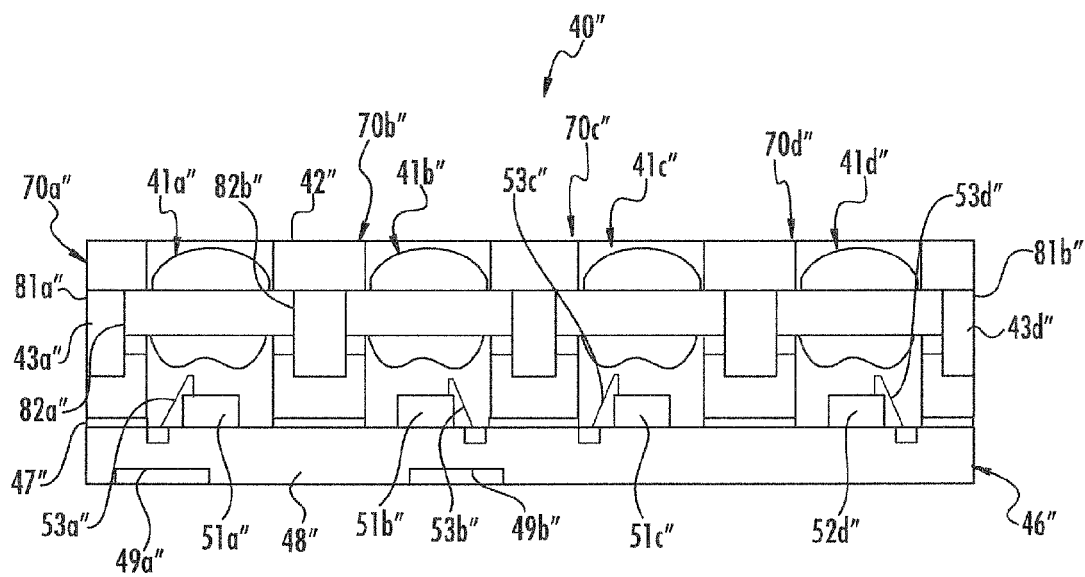
FIG. 4 is a schematic side view of yet another embodiment of an electronic device, according to the present disclosure.
Figure 5:
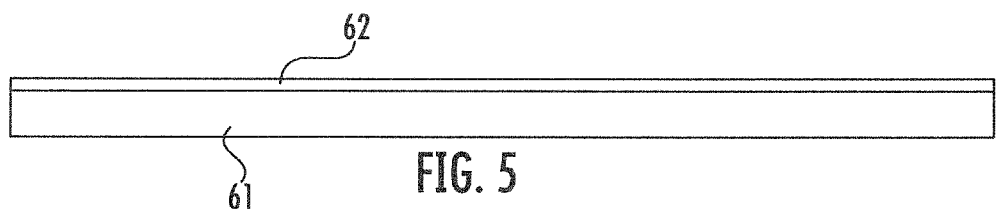
FIGS. 5-13 are schematic side views of steps for making the electronic devices of FIGS. 2-3.
Figure 6:
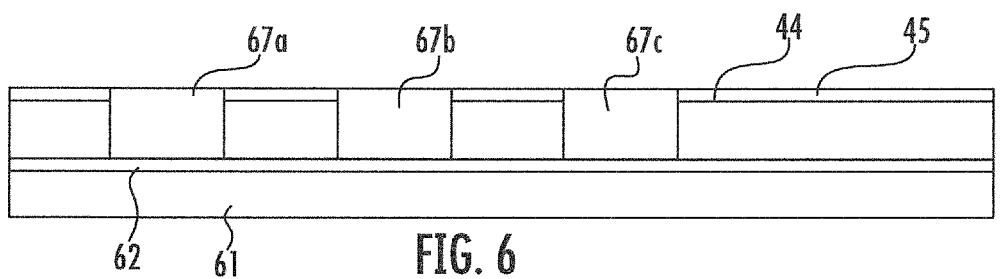
Figure 7:
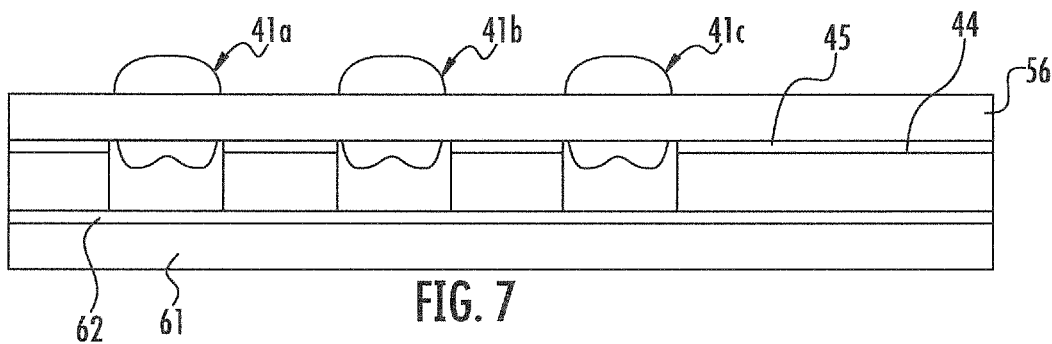
Figure 8:
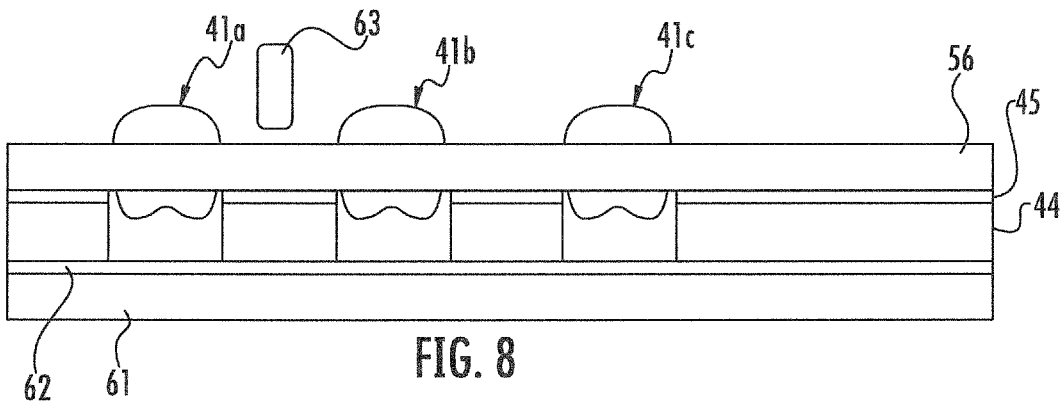
Figure 9:
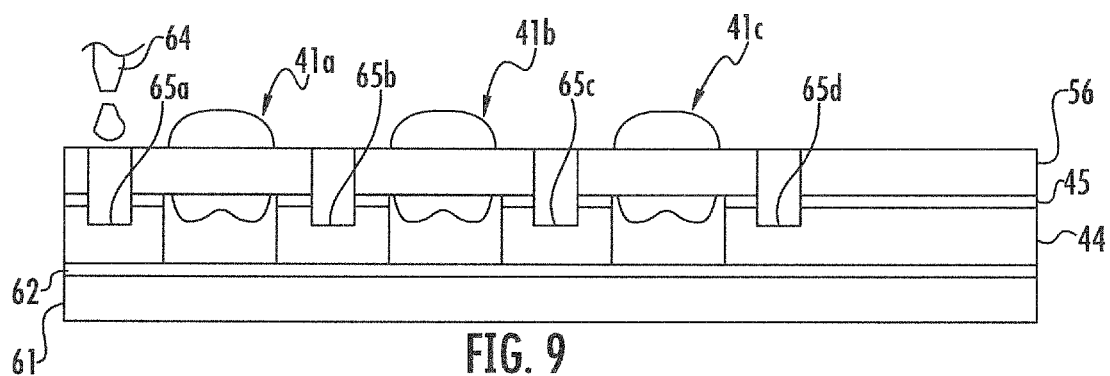
Figure 10:
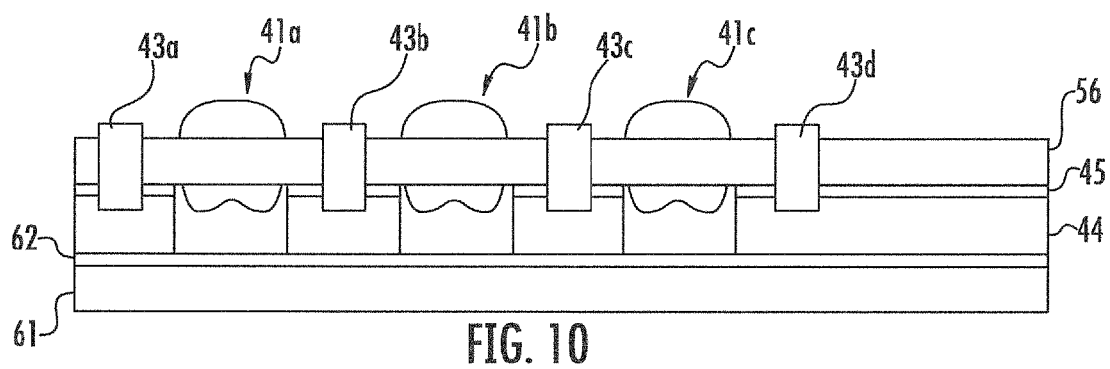
Figure 11:
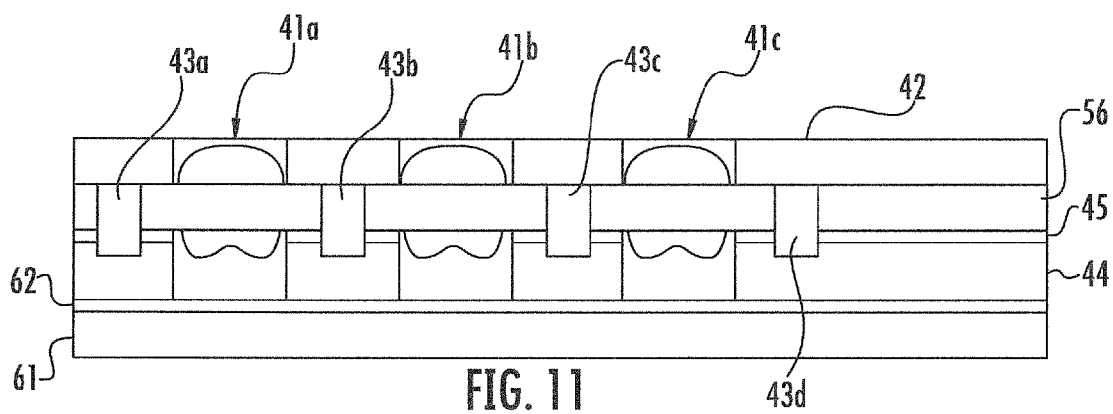
Figure 12:
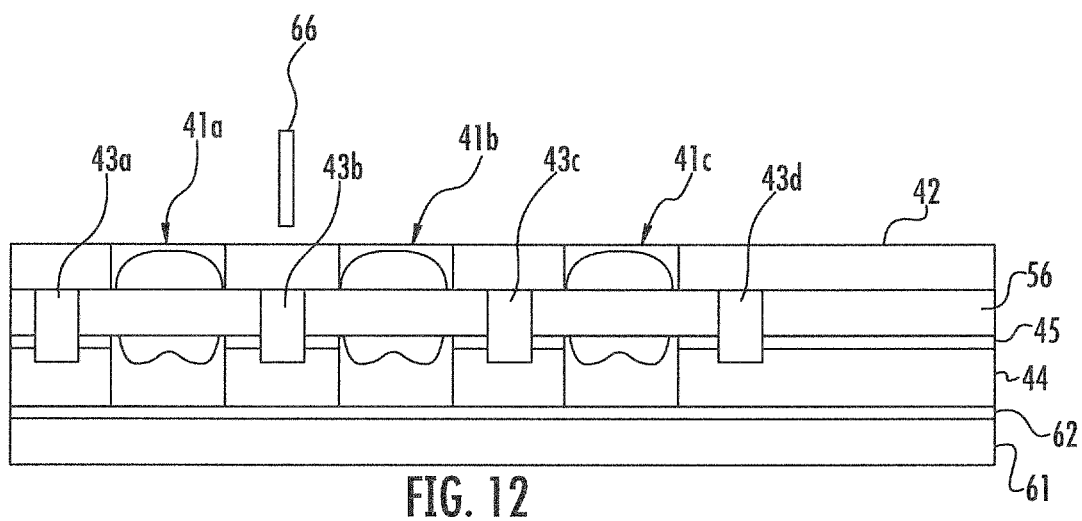
Figure 13:
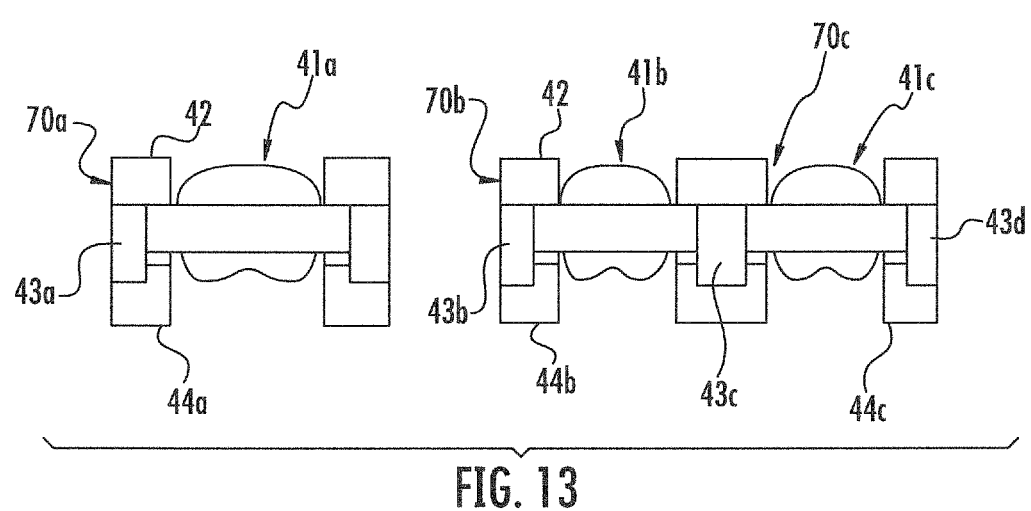

The lens assembly 70 illustratively includes a second adhesive layer 43 surrounding a peripheral surface 82a-82b of the lens 41 and the first adhesive layer 45. The second adhesive layer 43 also physically secures the lens 41 to the spacer 44. In some embodiments, the second adhesive layer 43 may comprise opaque material, which may provide lateral optical isolation, i.e. preventing cross-talk between adjacent detectors (FIGS. 3-4). In particular, the second adhesive layer 43 is opaque to visible electromagnetic radiation, thereby providing for greater accuracy in the electronic device 40.

The lens assembly 70 illustratively includes a baffle 42 carried by (over) the lens 41 and the second adhesive layer 43. The second adhesive layer 43 physically secures the baffle 42 and provides a downward retaining measure for the lens 41. In particular, the spacer 44, the second adhesive layer 43, and the baffle 42 illustratively have aligned peripheral surfaces 81a-81b, thereby advantageously providing a slim side profile. The second adhesive layer 43 may provide a mechanically resilient lateral edge for the lens assembly 70. Also, the baffle 42 and the spacer 44 are also opaque to visible electromagnetic radiation and may comprise identical materials.

The electronic device 40 may comprise a controller coupled to the image sensor IC 51. In proximity detector device embodiments, the controller may perform operations for proximity detection of a nearby object.

Referring now additionally to FIG. 3, another embodiment of the electronic device 40' is now described. In this embodiment of the electronic device 40', those elements already discussed above with respect to FIG. 2 are given prime notation and most require no further discussion herein. This embodiment differs from the previous embodiment in that this electronic device 40' illustratively includes first and second lenses assemblies 70a'-70b'. The electronic device 40' also illustratively includes first and second ICs 51a'-51b' carried by (over) the substrate 46'. In some embodiments, the first IC 51a' may comprise an image sensor IC, and the second IC 51b' may comprise an other IC.

The first lens assembly 70a' illustratively includes a first lens 41a' aligned with the first IC 51a', and the second lens assembly 70b' illustratively includes a second lens 41b' aligned with the second IC 51b'. The second IC 51b' may comprise at least one of a light source IC (e.g. light emitting diode (LED) light source IC), and an additional image sensor IC.

In the illustrated embodiment, the first and second lens assemblies 70a'-70b' are integrated into one-piece. In particular, the adjacent portions of the baffle 42', the second adhesive layer 43a'-43b', and the spacer 44a'-44b' are integral.

With reference to the prior art approach of FIG. 1, this approach may suffer from several drawbacks comprising a assembly procedure with many process steps, a complicated structure, difficult handling, and a need for high accuracy in for assembly equipment, such as P&P devices. Advantageously, this embodiment is more rigid and mechanically robust than prior approaches, such as that disclosed in FIG. 1. Also, this embodiment is less complex in structure, easier/cheaper to manufacture, and is smaller in size. Also, the added mechanical strength permits a faster P&P operation and with less risk of damage to the component. Moreover, the wafer level process for manufacturing disclosed herein may also provide for lower yield losses.

Referring now additionally to FIG. 4, another embodiment of the electronic device 40" is now described. In this embodiment of the electronic device 40", those elements already discussed above with respect to FIG. 2 are given double prime notation and most require no further discussion herein. This embodiment differs from the previous embodiment in that this electronic device 40" illustratively includes first, second, third, and fourth lenses assemblies 70a"-70d". The electronic device 40" also illustratively includes first, second, third, and fourth ICs 51a"-51d" carried by (over) the substrate 46". In some embodiments, the first, second, third, and fourth ICs 51a"-51d" may all comprise image sensor ICs or a combination of image sensor ICs and light sources (or other optical ICs). Also, the first, second, third, and fourth ICs 51a"-51d" comprise other special optical purpose ICs. In one advantageous embodiment, each of the first, second, third, and fourth ICs 51a"-51d" comprises an image sensor IC and the first, second, third, and fourth lenses assemblies 70a"-70d" respectively have varying focus distances for providing advanced proximity detection. In yet other embodiments, the lens assembly 70a"-70d" can be used in matrix lens assembly applications, such as 1×3, 1×4, 2×2, 4×4, and N×N.

Referring now to FIGS. 5-13, a method for making the lens assemblies 70, 70a'-70b' of the electronic devices 40, 40' (FIGS. 2-3) is now described. As will be appreciated, the disclosed method is a wafer level process, and although the illustrated embodiment provides a one-lens assembly module and a two-lens assembly module, the process can be readily modified to provide large numbers of lens assemblies.

The method illustratively includes providing a carrier layer 61, and an adhesive release layer 62 on the carrier layer. The method illustratively includes joining-together the carrier layer 61 and the spacer wafer 44, and forming the first adhesive layer 45 on the spacer wafer. The spacer wafer 44 illustratively includes a plurality of recesses/openings 67a-67c, which may be preformed or formed before attachment to the carrier layer 61 (e.g. milling (mechanical or laser), and etching).

The method illustratively includes adhesively joining a lens wafer 56 to the spacer wafer 44 with the first adhesive layer 45. The lens wafer 56 may comprise a glass base, or may comprise a material that is similarly transparent. The lens wafer 56 illustratively includes a plurality of lenses 41a-41c aligned respectively with the plurality of recesses 67a-67c of the spacer wafer 44. In other words, the adhesive joining of the lens wafer 56 to the spacer wafer 44 may include aligning the plurality of openings 67a-67c with the plurality of lenses 41a-41c. In some embodiments, the method may further comprise curing the joined-together lens wafer 56 and spacer wafer 44.

The method includes forming a plurality of recesses 65a-65d extending through the lens wafer 56 and first adhesive layer 45, and into the spacer wafer 44, each recess being between adjacent lenses 41a-41c. In the illustrated embodiment, the plurality of recesses 65a-65d is formed via a dicing blade 63. In other embodiments, the plurality of recesses 65a-65d may be formed using an etching technique or milling, for example.

The method includes filling the recesses 65a-65d with a second adhesive layer 43a-43d. In the illustrated embodiment, the second adhesive layer 43a-43d is dispensed via a nozzle 64. As shown, the second adhesive layer 43a-43d extends beyond the upper surface of the lens wafer 56. The method includes adhesively joining a baffle wafer 42 onto the second adhesive layer 43a-43d. The baffle wafer 42 illustratively includes a plurality of openings, and the adhesive joining of the baffle wafer to the lens wafer 56 and the spacer wafer 44 includes aligning the plurality of openings with the plurality of lenses 41a-41c.

The method also includes singulating or dicing (using the illustrated dicing blade 66) the joined-together spacer wafer 44, lens wafer 56, and baffle wafer to define the plurality of lens assemblies 70a-70c. The method also illustratively includes releasing the carrier layer 61 after the dicing, for example, by dissolving the adhesive release layer 62. The wafer level process disclosed herein may provide good versatility since the finished wafer product includes a two dimensional array of a large number of lens assemblies 70a-70c. Depending on the intended application, the singulation step may be customized to provide the desired configuration, i.e. singles (FIG. 2), doubles (FIG. 3), or matrix arrangement.

Another aspect is directed to a method making an electronic device 40 comprising forming a substrate 46 comprising a dielectric layer 48, and a plurality of electrically conductive traces 50 carried thereby (over the dielectric layer). The method may include forming an image sensor IC 51 carried by (over) the substrate 46, and forming a lens assembly 70 above the substrate. The lens assembly 70 may include a spacer 44 above the substrate 46, a first adhesive layer 45 carried by (over) the spacer, at least one lens 41 aligned with the image sensor IC 51 and carried by (over) the first adhesive layer, a second adhesive layer 43 surrounding a peripheral surface 82a-82b of the at least one lens and the first adhesive layer, and a baffle 42 carried by (over) the at least one lens and the second adhesive layer.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
    a substrate comprising a dielectric layer, and a plurality of electrically conductive traces over said dielectric layer;
    an image sensor integrated circuit (IC) over said substrate; and
    a lens assembly above said substrate and comprising
        a spacer above said substrate,
        a first adhesive layer over said spacer,
        at least one lens aligned with said image sensor IC and over said first adhesive layer,
        a second adhesive layer surrounding a peripheral surface of said at least one lens and said first adhesive layer, and
        a baffle over said at least one lens and said second adhesive layer.

2. The electronic device of claim 1 wherein said spacer, said second adhesive layer, and said baffle have aligned peripheral surfaces.

3. The electronic device of claim 1 wherein said second adhesive layer comprises opaque material.

4. The electronic device of claim 1 further comprising an other IC adjacent to said substrate; and wherein said at least one lens comprises a first lens aligned with said image sensor IC, and a second lens aligned with said other IC.

5. The electronic device of claim 4 wherein said other IC comprises at least one of a light source IC, and an additional image sensor IC.

6. The electronic device of claim 1 wherein said at least one lens comprises a base layer having first and second opposing sides, a convex lens layer on the first opposing side, and a concave lens layer on the second opposing side.

7. The electronic device of claim 1 further comprising a third adhesive layer between said substrate and said lens assembly.

8. The electronic device of claim 1 wherein said substrate comprises a plurality of electrically conductive contacts over said dielectric layer and coupled to said plurality of electrically conductive traces.

9. The electronic device of claim 1 wherein said at least one lens comprises a filter lens.

10. A lens assembly for an electronic device having a substrate comprising a dielectric layer, and a plurality of electrically conductive traces over the dielectric layer, and an image sensor integrated circuit (IC) over the substrate, the lens assembly comprising:
   a spacer above the substrate;
   a first adhesive layer over said spacer;
   at least one lens aligned with the image sensor IC and over said first adhesive layer;
   a second adhesive layer surrounding a peripheral surface of said at least one lens and said first adhesive layer; and
   a baffle over said at least one lens and said second adhesive layer.

11. The lens assembly of claim 10 wherein said spacer, said second adhesive layer, and said baffle have aligned peripheral surfaces.

12. The lens assembly of claim 10 wherein said second adhesive layer comprises opaque material.

13. The lens assembly of claim 10 wherein said at least one lens comprises a base layer having first and second opposing sides, a convex lens layer on the first opposing side, and a concave lens layer on the second opposing side.

14. A method making a plurality of lens assemblies comprising:
   adhesively joining a lens wafer to a spacer wafer with a first adhesive layer, the lens wafer comprising a plurality of lenses;
   forming a plurality of recesses extending through the lens wafer and first adhesive layer, and into the spacer wafer, each recess being between adjacent lenses;
   filling the recesses with a second adhesive layer;
   adhesively joining a baffle wafer onto the second adhesive layer; and
   dicing the joined-together spacer wafer, lens wafer, and baffle wafer to define the plurality of lens assemblies.

15. The method of claim 14 wherein the spacer wafer comprises a plurality of openings; and wherein the adhesive joining of the lens wafer to the spacer wafer includes aligning the plurality of openings with the plurality of lenses.

16. The method of claim 14 further comprising curing the joined-together lens wafer and spacer wafer.

17. The method of claim 14 wherein the baffle wafer comprises a plurality of openings; and wherein the adhesive joining of the baffle wafer to the lens wafer and the spacer wafer includes aligning the plurality of openings with the plurality of lenses.

18. The method of claim 14 further comprising forming the spacer wafer on a carrier layer, and releasing the carrier layer after the dicing.

19. A method making an electronic device comprising:
   forming a substrate comprising a dielectric layer, and a plurality of electrically conductive traces over the dielectric layer;
   forming an image sensor integrated circuit (IC) over the substrate; and
   forming a lens assembly above the substrate, the lens assembly comprising
      a spacer above the substrate,
      a first adhesive layer over the spacer,
      at least one lens aligned with the image sensor IC and over the first adhesive layer,
      a second adhesive layer surrounding a peripheral surface of the at least one lens and the first adhesive layer, and
      a baffle over the at least one lens and the second adhesive layer.

20. The method of claim 19 further comprising aligning peripheral surfaces of the spacer, the second adhesive layer, and the baffle.

21. The method of claim 19 wherein the second adhesive layer comprises opaque material.

22. The method of claim 19 further comprising positioning an other IC to be adjacent to the substrate; and wherein the at least one lens comprises a first lens aligned with the image sensor IC, and a second lens aligned with the other IC.

23. The method of claim 19 wherein the at least one lens comprises a base layer having first and second opposing sides, a convex lens layer on the first opposing side, and a concave lens layer on the second opposing side.

24. The method of claim 19 further comprising forming a third adhesive layer between the substrate and the lens assembly.

25. The method of claim 19 wherein the substrate comprises a plurality of electrically conductive contacts over the dielectric layer and coupled to the plurality of electrically conductive traces.

* * * * *